United States Patent
Guha et al.

(10) Patent No.: US 6,468,829 B2
(45) Date of Patent: Oct. 22, 2002

(54) METHOD FOR MANUFACTURING HIGH EFFICIENCY PHOTOVOLTAIC DEVICES AT ENHANCED DEPOSITIONS RATES

(75) Inventors: Subhendu Guha, Bloomfield Hills, MI (US); Chi C. Yang, Troy, MI (US); Kenneth Lord, Rochester Hills, MI (US)

(73) Assignee: United Solar Systems Corporation, Troy, MI (US)

( * ) Notice: Subject to any disclaimer, the term of this patent is extended or adjusted under 35 U.S.C. 154(b) by 0 days.

(21) Appl. No.: 09/850,836

(22) Filed: May 8, 2001

(65) Prior Publication Data

US 2001/0051389 A1 Dec. 13, 2001

Related U.S. Application Data

(60) Provisional application No. 60/204,410, filed on May 16, 2000.

(51) Int. Cl.$^7$ .............................. H01L 21/00
(52) U.S. Cl. ....................................... 438/96
(58) Field of Search ................. 438/87, 96, 97, 438/482, 485, 488; 136/255, 258, 261

(56) References Cited

U.S. PATENT DOCUMENTS

| | | | |
|---|---|---|---|
| 4,217,374 A | 8/1980 | Ovshinsky et al. | 427/39 |
| 4,226,898 A | 10/1980 | Ovshinsky et al. | 427/39 |
| 4,569,697 A * | 2/1986 | Tsu et al. | |
| 5,034,333 A | 7/1991 | Kim | 437/4 |
| 5,248,348 A | 9/1993 | Miyachi et al. | 136/258 |
| 5,256,576 A | 10/1993 | Guha et al. | 437/4 |
| 5,298,086 A | 3/1994 | Guha et al. | 136/249 |
| 5,417,770 A * | 5/1995 | Saitoh et al. | |
| 5,476,798 A | 12/1995 | Guha | 437/4 |
| 5,676,765 A | 10/1997 | Saito et al. | 136/258 |
| 5,677,236 A | 10/1997 | Saitoh et al. | 437/109 |
| 5,719,076 A * | 2/1998 | Guha | |
| 5,736,431 A | 4/1998 | Shinohara et al. | 438/96 |
| 6,025,039 A * | 2/2000 | Yajima | |
| 6,124,545 A * | 9/2000 | Bauer et al. | |
| 6,268,233 B1 * | 7/2001 | Sano | |

* cited by examiner

Primary Examiner—Keith Christianson
(74) Attorney, Agent, or Firm—Gifford, Krass, Groh, Sprinkle, Anderson & Citkowski, P.C.

(57) ABSTRACT

A P-I-N type photovoltaic device is manufactured by a process wherein the deposition rate of the intrinsic layer is controlled so that a portion of the intrinsic layer which is closest to the P-I interface, and which comprises at least 10% of the thickness of the intrinsic layer, is deposited at a rate which is less than the average rate at which the entire intrinsic layer is deposited.

20 Claims, 1 Drawing Sheet

METHOD FOR MANUFACTURING HIGH EFFICIENCY PHOTOVOLTAIC DEVICES AT ENHANCED DEPOSITIONS RATES

RELATED APPLICATION

This patent application claims priority of U.S. provisional patent application Ser. No. 60/204,410 filed May 16, 2000 and also entitled "Method for Manufacturing High Efficiency Photovoltaic Devices at Enhanced Deposition Rates."

FIELD OF THE INVENTION

This invention relates generally to photovoltaic devices. More specifically, the invention relates to photovoltaic devices of the P-I-N type. Most specifically, the invention relates to a high deposition rate process for the preparation of P-I-N type photovoltaic devices, which devices have performance characteristics which are at least equal to the performance characteristics of comparable devices made at lower deposition rates.

BACKGROUND OF THE INVENTION

Photovoltaic devices provide clean, quiet and reliable sources of electrical power. The earliest photovoltaic devices were manufactured from single crystalline material. These devices were expensive, delicate, relatively bulky and difficult to manufacture in large area configurations. Various techniques have now been developed for preparing thin film semiconductor materials which manifest electrical properties which are equivalent, and in many instances, superior, to their crystalline counterparts. Such thin film materials may be readily deposited over very large areas and on a variety of substrates. Such alloys and techniques for their preparation are disclosed, for example, in U.S. Pat. Nos. 4,226,898 and 4,217,374. One important class of photovoltaic devices comprises a layer of substantially intrinsic semiconductor material interposed between two oppositely doped semiconductor layers. Such devices are termed P-I-N or N-I-P devices depending on the order of the layers, and these two terms shall be used interchangeably herein. In many instances, a series of such P-I-N devices may be stacked in tandem so as to be in a series electrical and optical relationship.

Thin film semiconductor materials may be prepared by a variety of techniques, and vapor deposition techniques are one particularly preferred class of deposition processes. In a typical vapor deposition technique, a process gas, which includes a precursor of the semiconductor material, is introduced into a deposition apparatus, most typically at reduced pressures. The process gas typically comprises a mixture of materials. In the apparatus, the process gas is subjected to activating energy which decomposes the process gas into deposition species, and these species are contacted with a substrate upon which they deposit a layer of semiconductor material. Typically, the substrate is maintained at an elevated temperature so as to facilitate the deposition. By varying the process gas and deposition conditions, succeeding layers of semiconductor material of various compositions and types may be deposited in sequence upon a substrate so as to create various configurations and devices. The activating energy employed to create the deposition species may comprise one or more of thermal energy, electromagnetic energy (including direct current, radio frequency energy and microwave energy) as well as photon energy or thermal energy. Deposition techniques of this general type are well known in the art, and while the present invention will be primarily described with reference to electromagnetically energized plasma deposition processes, it is to be understood that the present invention may be utilized in connection with other such thin film deposition processes.

It is conventional wisdom in the photovoltaic arts that photovoltaic devices manufactured in a high rate deposition process have performance characteristics, as measured by parameters such as fill factor and efficiency, which are lower than are those of comparable devices manufactured in a lower rate deposition process. Clearly, economics favors the use of high speed deposition processes for the large scale manufacture of photovoltaic devices. At the same time, it is also desirable that such devices have high efficiencies. Heretofore, the parameters of high deposition rate and high efficiency have been mutually exclusive.

In accord with the present invention, it has been found that through the control of deposition rates, photovoltaic devices can be manufactured at an overall high average rate of deposition and still manifest performance characteristics which are equal to, and in some instances superior to, those of comparable devices manufactured through the use of a lower rate process.

BRIEF DESCRIPTION OF THE INVENTION

There is disclosed herein a method for the manufacture of a P-I-N type semiconductor device which is comprised of a body of substantially intrinsic semiconductor material disposed between a body of P type semiconductor material and a body of N type semiconductor material. In a first step of the method, there is provided a first, doped body of semiconductor material of a first conductivity type. A deposition apparatus, having a deposition region defined therein, is provided, and this process gas is subjected to activating energy which decomposes it into deposition species. The first, doped body of semiconductor material is contacted with said deposition species in said deposition region so that the deposition species deposit a body of substantially intrinsic semiconductor material onto the first, doped body at an average deposition rate of N. A second, doped body of semiconductor material of a second conductivity type, opposite the first conductivity type, is deposited upon the body of substantially intrinsic material so that the second, doped body of semiconductor material is separated from the first, doped body of semiconductor material by the body of substantially intrinsic semiconductor material. In accord with the present invention, the rate at which the deposition species deposit the body of substantially intrinsic material onto the first, doped body is controlled so that a portion of the body of substantially intrinsic semiconductor material which is disposed closest to the interface with the P type semiconductor material, and which comprises at least 10% of the thickness of the body of substantially intrinsic semiconductor material, is deposited at a deposition rate which is less than N.

In one embodiment of the invention, the low deposition rate portion of the body of substantially intrinsic semiconductor material comprises at least 20% of the thickness of the body of substantially intrinsic semiconductor material. In another embodiment of the invention, the low deposition rate portion comprises at least 30% of the thickness of the body, and in yet another embodiment, the low deposition rate portion comprises no more than 50% of the thickness of the body.

The rate of deposition may be controlled by controlling the intensity of activating energy to which the process gas is subjected. In other embodiments, the deposition rate is controlled by controlling the composition and/or pressure of the process gas, and in yet other embodiments, the deposition rate is controlled by controlling the access of the deposition species to the first, doped body of semiconductor material, or by controlling substrate temperature.

The activating energy may comprise electromagnetic energy, which may be direct or alternating current energy. In some embodiments, the activating energy is radio frequency energy, and in other embodiments, the activating energy is microwave energy. In yet other embodiments, the activating energy may comprise photon energy.

DETAILED DESCRIPTION OF THE INVENTION

This invention will be explained with regard to P-I-N type photovoltaic devices; although, it is to be understood that the principles of this invention may be implemented in photovoltaic devices of other configurations such as P-N devices, Schottky barrier devices and the like. Also, the principles of the present invention may be applied to other electronic devices such as electrophotographic photoreceptors as well as non-photoresponsive devices, as will be apparent to one of skill in the art.

As is understood in the art, a P-I-N type photovoltaic device comprises a substantially intrinsic body of semiconductor material interposed between oppositely doped semiconductor layers. Generally, the intrinsic layer is the thickest layer of the device, and the principles of the present invention are directed toward minimizing the time required for the deposition of this intrinsic layer, while maintaining or improving performance qualities of the device.

Specifically, it has been found that in a P-I-N type photovoltaic device superior performance, as measured by one or more characteristics such as fill factor, efficiency, open circuit voltage, short circuit current and the like, is achieved if that portion of the intrinsic layer closest to the P/I interface is prepared at a lower deposition rate than is the remainder of the material. In such instance, the performance characteristics of the device are superior to those achieved in a comparable device wherein the entirety of the intrinsic layer is prepared at a uniform deposition rate which is equal to the average rate (N) at which the intrinsic layer of the devices of the present invention are prepared. This effect is found to be significant even when the portion of the intrinsic layer prepared at the low rate constitutes as little as 10 to 20% of the total thickness of the intrinsic layer. Generally, it is preferred that the low rate portion is deposited at 0.5N or less, and more preferably at 0.25N or less.

Figure 1:
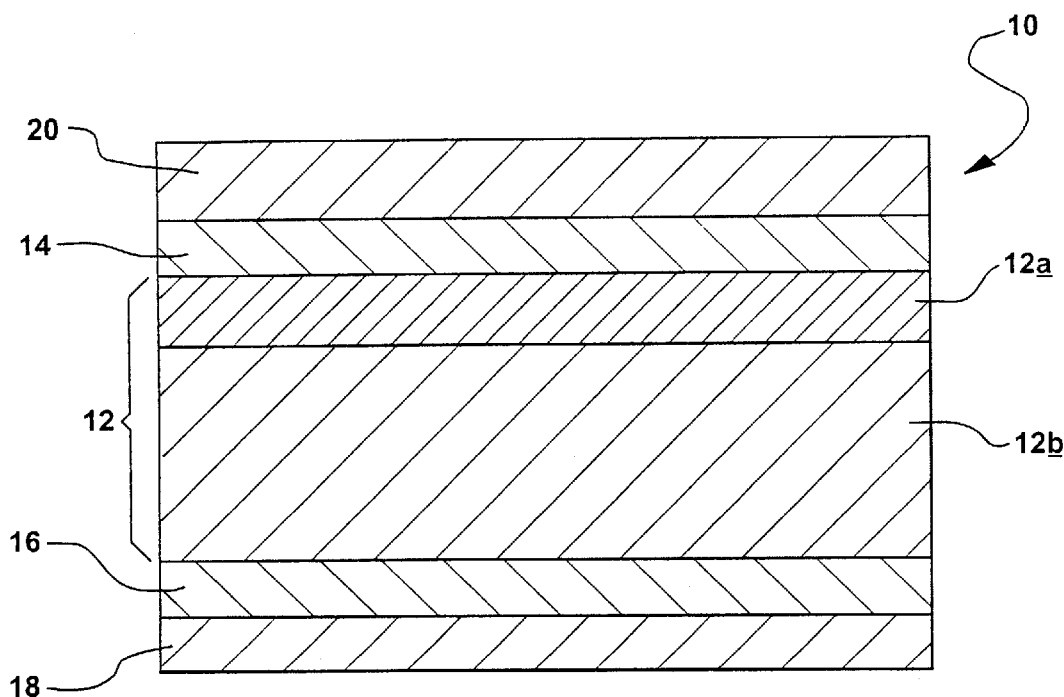
FIG. 1 is a cross-sectional view of a generalized P-I-N type photovoltaic device of the present invention.

Referring now to FIG. 1, there is shown a cross-sectional view of a P-I-N type photovoltaic device 10 structured in accord with the principles of the present invention. The device 10 comprises a body of substantially intrinsic thin film silicon alloy material 12 interposed between a layer of P doped silicon alloy material 14 and a layer of N doped silicon alloy material 16. This structure is typical of P-I-N type photovoltaic devices well known in the prior art. The silicon alloy material may comprise an amorphous, microcrystalline, or polycrystalline alloy material and may include alloying elements such as hydrogen, halogens, germanium, carbon, nitrogen and the like. In the context of this disclosure, the layer 12 is referred to as being substantially intrinsic since, while it is of essentially intrinsic conductivity type, it may be slightly P type or slightly N type and still function as an intrinsic layer within the context of the P-I-N type photovoltaic device. In a particularly preferred embodiment of the invention, the layer of P doped semiconductor material 14 is a microcrystalline layer manifesting high electrical conductivity and high optical transparency.

The photovoltaic device 10 further includes a substrate 18 which is electrically conductive and which functions as a bottom electrode of the device. The substrate 18 may comprise a body of metal such as stainless steel and the like or an insulating material such as glass, ceramic or a polymer, having an electrically conductive coating thereupon. In particular embodiments, the substrate 18 may include a highly reflective layer fabricated of silver or the like, and may be texturized to increase light scattering therefrom. The photovoltaic device 10 of FIG. 1 further includes a top electrode layer 20 preferably fabricated from a transparent conductive metal oxide (TCO), such as indium oxide, tin oxide and combinations thereof.

It is to be understood that the device 10 of FIG. 1 is merely representative of a typical photovoltaic device, and in actual configuration, may comprise an array of vertically stacked P-I-N type photovoltaic devices. Also, the device referred to herein as a P-I-N type photovoltaic device may be manufactured in an inverted condition so as to have the N layer 16 proximate the top electrode 20. Within the context of this disclosure, all such structures are equivalent, and the principles of the present invention may be applied to all.

In accord with the present invention, the intrinsic layer 12 is prepared so that a portion 12a, which is closest to the interface between the intrinsic layer 12 and the P doped layer 14, is deposited at a deposition rate which is lower than the deposition rate at which the remainder 12b of the intrinsic layer 12 is deposited. In this manner, the entire intrinsic layer 12 is deposited at an average deposition rate N, and the portion 12a closest to the P layer 14 is a low rate portion deposited at a deposition rate less than N.

The principles of the present invention may be implemented in connection with various processes for the deposition of thin film semiconductor materials. Thin film semiconductor materials are very often fabricated by plasma glow discharge deposition processes wherein electromagnetic energy, typically radio frequency energy and/or microwave energy, is employed to activate a process gas and create a plasma therefrom. The plasma is comprised of activated deposition species, which deposit the semiconductor material onto a substrate which is typically maintained at an elevated temperature and is disposed so as to be contacted by the activated deposition species.

Figure 2:
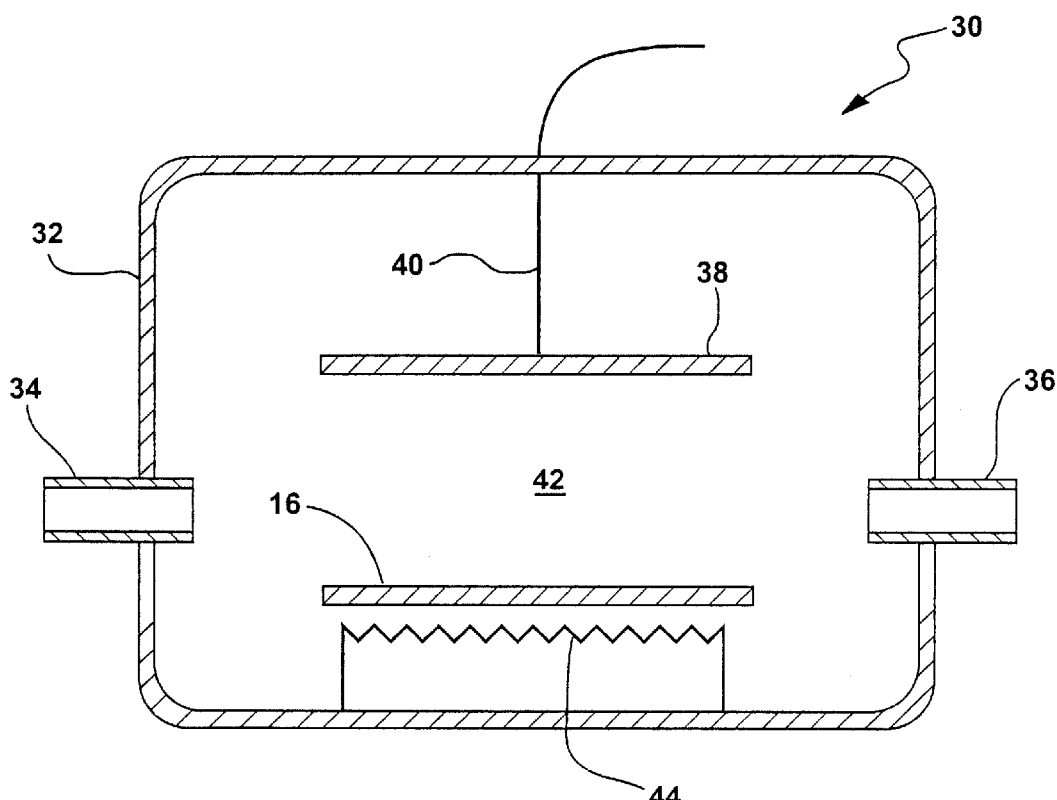
FIG. 2 is a cross-sectional view of a deposition apparatus which may be used in the practice of the present invention.

Referring now to FIG. 2, there is shown a stylized depiction of a plasma glow discharge deposition apparatus 30. The deposition apparatus 30 includes a deposition chamber 32 capable of sustaining a reduced pressure atmosphere therein. The chamber 32 includes a gas inlet 34 which is connected to a source of a process gas, and a gas outlet 36 which is connected to a pumping system. By control of the gas inlet 34 and the gas outlet 36, the process gas atmosphere within the chamber 32 may be maintained at a desired level. The apparatus 30 of FIG. 2 further includes an electrode 38 which is disposed therein. The electrode 38 is in electrical communication with a power supply (not shown) by a lead 40.

In the operation of the apparatus 30, a substrate member having the first layer of semiconductor material thereupon (for example layer 16 of FIG. 1) is disposed within the chamber 32. A process gas is introduced into the chamber and activating energy is applied to the gas via the electrode 38. This activating energy creates a plasma from the process gas in a deposition region 42 proximate to the electrode 38, and deposition species formed in the deposition region 42 act to deposit a layer of semiconductor material onto the layer 16 supported therein. As is known in the art, this deposition can be controlled and facilitated by appropriately heating the layer 16, and in this regard, the apparatus 30 of FIG. 2 includes a substrate heater therein. This substrate heater may comprise a resistive heater 44 as is shown in FIG. 2, or may comprise a radiant heater or the like.

In accord with the present invention, the deposition process whereby the intrinsic layer is deposited, is controlled so that the portion of the intrinsic layer which is, or will be, closest to the P layer is deposited at a rate lower than is the remainder of the intrinsic layer. As is known in the art, the deposition rate of semiconductor materials in a vapor deposition process may be controlled by controlling the intensity of activating energy applied to the process gas, and in this regard, the level of power applied to the electrode 38 may be decreased so as to decrease the deposition rate. Likewise, deposition rate may be controlled by changing the pressure and/or composition of the process gas. For example, depositions carried out at lower pressures tend to proceed at lower rates as compared to depositions carried out at higher pressures. Also, diluents may be added to a process gas so as to decrease the amount of semiconductor precursor therein, and thereby decrease the deposition rate. Also, the presence of etchant species, such as halogens, in the process gas is known to decrease deposition rates. Also, substrate temperature is known to influence the deposition rate of semiconductor materials in processes of this type. It is also known to those of skill in the art that the deposition rate of a plasma process may be controlled by controlling the frequency of activating energy applied to a process gas, since certain frequencies couple more effectively to certain process gas mixtures. Deposition rate is also known to be dependent on substrate temperature; therefore, this parameter provides yet another means for implementing the present invention.

In summary, it should be apparent that one of skill in the art can readily control one or more parameters of a plasma deposition process so as to increase or decrease the deposition rate of a particular semiconductor material. In accord with the present invention, the deposition can be carried out at a relatively high average deposition rate, but still produce high quality photovoltaic devices which were heretofore only capable of being produced at overall lower deposition rates.

It should be kept in mind that the FIG. 2 apparatus is schematic, and is meant to depict a stylized deposition process. Many other types of apparatus may be likewise used in the practice of the present invention. For example, activating energy may be input from a microwave antenna, a wave guide or the like. Likewise, activation may be accomplished by use of a free radical generator, a source of high energy photons or the like. Also, the apparatus used for the deposition of the present invention may be a continuous process apparatus, such as a roll to roll apparatus, all in keeping with the present invention.

A series of experiments were conducted to illustrate the principles of the present invention. A first experimental series comprises computer simulations of P-I-N type photovoltaic devices in which the intrinsic layer comprises an amorphous silicon-hydrogen alloy deposited at different rates. The computer simulation which was employed is the EPRI-AMPS simulation, as is known in the art. This simulation includes no provision for the rate at which the materials of the device are deposited; however, the simulation does include parameters relating to the defect density of the semiconductor material constituting the device, and it is known that this parameter is directly correlatable with deposition rate, when all other factors are held constant. Therefore, for purposes of the simulation, it was assumed that material prepared at a deposition rate of 1 angstrom per second had a defect density of $5 \times 10^{16}/cm^3$; material prepared at 2 angstroms per second had a defect density of $1.25 \times 10^{17}/cm^3$; and material prepared at a deposition rate of 3 angstroms per second had a defect density of $2 \times 10^{17}/cm^3$. The simulation was run on the basis of P-I-N type cells in which the intrinsic layer was of 2000 angstroms thickness. The results of this simulation are summarized in Table 1.

TABLE 1

EPRI-AMPS Simulations

| Simulation | Thick (Å) | Eff. (%) | Jsc (mA/cm²) | Voc (V) | FF AM 1.5 | FF red | FF blue |
|---|---|---|---|---|---|---|---|
| 1. n1p | 2000 | 8.01 | 12.77 | 0.897 | 0.699 | 0.661 | 0.743 |
| 2. n2p | 2000 | 7.12 | 12.47 | 0.873 | 0.654 | 0.608 | 0.72 |
| 3. n13p (50/50) | 2000 | 6.72 | 12.36 | 0.861 | 0.631 | 0.585 | 0.705 |
| 4. n31p (50/50 | 2000 | 7.7 | 12.58 | 0.891 | 0.686 | 0.647 | 0.741 |
| 5. n31p (70/30) | 2000 | 7.28 | 12.39 | 0.882 | 0.667 | 0.625 | 0.73 |
| 6. n31p (80/20) | 2000 | 7.01 | 12.28 | 0.874 | 0.653 | 0.608 | 0.72 |
| 7. n31p (90/10) | 2000 | 6.69 | 12.18 | 0.865 | 0.635 | 0.588 | 0.709 |

In device 1 of Table 1, the entirety of the intrinsic layer was deposited at 1 angstrom per second. This device constitutes the benchmark measurement for the remaining devices. The simulation lists the efficiency, short circuit current, and open circuit voltage as well as fill factors measured at AM 1.5, and under red and blue light respectively.

The second device had the entirety of its intrinsic layer deposited at a rate of 2 angstroms per second. Overall efficiency declined from 8.01 to 7.12, and the AM 1.5 fill factor declined from 0.699 to 0.654. Corresponding drops were seen in open circuit voltage and short circuit current. In the third device, half of the intrinsic layer was deposited at a rate of 1 angstrom per second and the other half at 3 angstroms per second, with the high deposition rate material being closest to the P/I interface. This device is manufactured contrary to the principles of the present invention. As will be seen from Table 1, performance characteristics of this device are lower than those of device 2, even though the average deposition rate for the intrinsic layer was the same. Device 4 is generally similar to device 3 except that the high deposition rate material is closest to the N/I interface and the low deposition rate material closest to the P/I interface, in accord with the principles of the present invention. It is notable that in this device, performance characteristics all rose as compared to device 3. It is even more significant that the performance characteristics of this device exceed those of device 2, even though the average deposition rate for device 4 and device 2 is the same.

Device 5 has an intrinsic layer in which 70% of the thickness is deposited at 3 angstroms per second and 30% at 1 angstrom per second with the low rate material being at the P/I interface. It is notable that the efficiency, open circuit voltage and fill factor of this device exceeds that of device 2, even though the average deposition rate for this device is greater than that of the FIG. 2 device. Devices 6 and 7 are configured generally similar to device 5, except that the portion of low deposition rate material is still further increased. As will be seen, benefits of the present invention are still achieved even when only 10% of the thickness of the intrinsic layer is made from low rate material, and the benefits are very strongly present when 20% of the thickness is low rate material. This series of computer simulations clearly demonstrates the anticipated benefits of the present invention.

A group of actual photovoltaic devices were manufactured for the purpose of verifying the predictions of the computer simulation. The devices chosen for this experimental series are P-I-N type photovoltaic devices wherein the intrinsic layer thereof is comprised of an alloy of 80% hydrogenated amorphous silicon and 20% hydrogenated amorphous germanium. The thickness of the intrinsic layer is approximately 2000 angstroms, and the respective N and P layers are of several hundred angstroms thickness. This cell is typical of cells used as the middle cell in triple tandem photovoltaic devices. The specific alloy material chosen is relatively sensitive to deposition rate effects and hence provides a realistic and stringent test for the principles of the present invention. Table 2 summarizes the results of this experimental series.

TABLE 2

BMW Experiments ($\lambda > 530$ nm)

| Run | Jsc (Q) (mA/cm$^2$) | Voc (V) | FF | Eff (%) |
|---|---|---|---|---|
| 8. n1p | 10.9 | 0.726 | 0.555 | 4.38 |
| 9. n2p | 10.0 | 0.719 | 0.537 | 3.86 |
| 10. n3p | 8.6 | 0.723 | 0.527 | 3.24 |
| 11. n13p (50/50) | 9.1 | 0.728 | 0.487 | 3.22 |
| 12. n31p (50/50) | 10.7 | 0.716 | 0.545 | 4.18 |

The fill factor in this experiment was measured at 530 nm, which corresponds to illumination reaching a middle cell in a triple tandem device. Cell 8 is generally similar to simulated cell 1 and includes an intrinsic layer deposited entirely at a rate of 1 angstrom per second. This cell forms the benchmark for assessment of the remaining devices. Cell 9 corresponds to cell 2 of Table 1. In this device, the entirety of the intrinsic layer was deposited at 2 angstroms per second. Reference to Table 2 shows that all performance characteristics of this device are degraded somewhat as compared to those of cell 8. Cell 10 has an intrinsic layer which was entirely deposited at 3 angstroms per second. Performance characteristics of this device are inferior to those of cell 9 and cell 8. Cell 11 has an intrinsic layer in which half was deposited at 1 angstrom per second and the other half at 3 angstroms per second, with the low deposition rate material being closest to the N/I interface. The configuration of this cell is contrary to the principles of the present invention and corresponds to device 3 of Table 1. The performance characteristics of cell 11 are inferior to those of both cell 9 and cell 10. Cell 12 is generally similar to cell 11, except that the low deposition rate material is closest to the P/I interface, and in this regard, the cell corresponds to cell 4 of Table 1. As will be seen, the performance characteristics of this cell (except for open circuit voltage which is statistically insignificant) are superior to those of cell 9, even though the average deposition rate for the intrinsic layer is the same in the two cells.

As will be clearly seen from the computer simulation, and as is confirmed by actual experimental data, high quality photovoltaic devices can be manufactured at relatively high deposition rates, if a portion of the intrinsic layer of the device closest to the P/I interface is prepared from material deposited at a relatively low deposition rate, with the remainder of the material being deposited at a high rate. Devices thus manufactured, at a specific, average deposition rate, will have performance characteristics which exceed those of similar devices in which the entire intrinsic layer was deposited at a uniform rate equal to the average rate. The effects of the present invention are manifested even when relatively thin portions of the intrinsic layer, typically 10% or more, are low deposition rate materials. The effect is very strongly present when at least 20% of the thickness of the intrinsic layer is low rate material. The low rate portion of the device of the present invention will comprise at least 10% of the thickness of the intrinsic layer. Typically, it will comprise 20% or more of the thickness, and in particular embodiments it will be 30% or more of the thickness. Generally, the low rate portion should not be more than 50% of the intrinsic layer thickness if the economic advantages of the invention are to be maximized; although in certain instances, such thicknesses may be advantageous.

The present invention is not limited to plasma deposition processes, but may be extended to other processes such as chemical vapor deposition, sputtering, hot wire deposition and the like. In such processes, deposition rate can be readily controlled by manipulation of appropriate process parameters, as is known to those of skill in the art. The principles of the present invention may also be extended to semiconductor devices other than P-I-N photovoltaic devices.

In view of the teaching presented herein, numerous modifications and variations of the present invention will be apparent to one of skill in the art.

What is claimed is:

1. A method for the manufacture of a P-I-N type semiconductor device which is comprised of a body of substantially intrinsic semiconductor material disposed between a body of P type semiconductor material and a body of N type semiconductor material, said method comprising the steps of:

providing a first, doped body of semiconductor material of a first conductivity type;

providing a deposition apparatus having a deposition region defined therein;

providing a process gas which includes a precursor of said substantially intrinsic semiconductor material therein;

subjecting said process gas to activating energy which decomposes said process gas into deposition species;

contacting said first, doped body of semiconductor material with said deposition species in said deposition region so that said deposition species deposit said body of substantially intrinsic semiconductor material onto said first, doped body at an average deposition rate N;

depositing a second, doped body of semiconductor material of a second conductivity type, opposite said first conductivity type, upon said body of substantially intrinsic semiconductor material so that said second, doped body of semiconductor material is separated from said first, doped body of semiconductor material by said body of substantially intrinsic semiconductor material; and controlling the rate at which said deposition species deposits said body of substantially intrinsic semiconductor material onto said first, doped body so that a portion of said body of substantially intrinsic semiconductor material which is disposed closest to its interface with said P type semiconductor material, and which comprises at least 10% of the thickness of said body of substantially intrinsic semiconductor material is deposited at a deposition rate which is less than N.

2. The method of claim 1, wherein said portion of said body of substantially intrinsic semiconductor material comprises at least 20% of the thickness of said body.

3. The method of claim 2, wherein said portion comprises no more than 50% of the thickness of said body.

4. The method of claim 1, wherein said portion of said body of substantially intrinsic semiconductor material comprises at least 30% of the thickness of said body.

5. The method of claim 4, wherein said portion comprises no more than 50% of the thickness of said body.

6. The method of claim 1, wherein the step of controlling said rate of deposition comprises controlling the intensity of activating energy to which said process gas is subjected.

7. The method of claim 1, wherein the step of controlling said deposition rate comprises controlling the composition of said process gas.

8. The method of claim 1, wherein the step of controlling said deposition rate comprises controlling the pressure of said process gas.

9. The method of claim 1, wherein the step of controlling said deposition rate comprises controlling the access of said deposition species to said first, doped body of semiconductor material.

10. The method of claim 1, wherein said deposition apparatus comprises a glow discharge deposition apparatus, and wherein said activating energy comprises electromagnetic energy.

11. The method of claim 10, wherein said electromagnetic energy comprises radio frequency energy.

12. The method of claim 10, wherein said electromagnetic energy comprises microwave energy.

13. The method of claim 1, wherein said activating energy comprises photon energy.

14. The method of claim 1, wherein said first doped body of semiconductor material comprises a P type semiconductor material and said second doped body of semiconductor material comprises an N type semiconductor material.

15. The method of claim 1, wherein said first doped body of semiconductor material comprises an N type semiconductor material and said second doped body of semiconductor material comprises a P type semiconductor material.

16. The method of claim 1, wherein said body of substantially intrinsic semiconductor material comprises an alloy of silicon and hydrogen.

17. The method of claim 16, wherein said alloy of silicon and hydrogen further includes germanium.

18. The method of claim 1, wherein said first doped body of semiconductor material is maintained at a temperature T while it is being contacted with said deposition species, and wherein the step of controlling the deposition rate comprises varying said temperature.

19. The method of claim 1, wherein said deposition rate which is less than N is no more than 0.5N.

20. The method of claim 1, wherein said deposition rate which is less than N is no more than 0.25N.

* * * * *